United States Patent
Miyahara

[11] Patent Number: 6,145,365
[45] Date of Patent: Nov. 14, 2000

[54] METHOD FOR FORMING A RECESS PORTION ON A METAL PLATE

[75] Inventor: Hideyuki Miyahara, Okaya, Japan

[73] Assignee: Nakamura Seisakusho Kabushikigaisha, Okaya, Japan

[21] Appl. No.: 09/161,807

[22] Filed: Sep. 28, 1998

[30] Foreign Application Priority Data

Sep. 29, 1997 [JP] Japan .................................. 9-282768
Sep. 29, 1997 [JP] Japan .................................. 9-282769

[51] Int. Cl.$^7$ .................................................. B21D 28/02
[52] U.S. Cl. .................................. 72/332; 72/324; 72/340
[58] Field of Search .............................. 72/327, 324, 326, 72/334, 335, 340, 332

[56] References Cited

U.S. PATENT DOCUMENTS

| 2,807,970 | 10/1957 | Dorman | 72/340 |
| 3,017,789 | 1/1962 | Cobb | 72/334 |
| 5,397,921 | 3/1995 | Karnezos | 257/779 |
| 5,409,865 | 4/1995 | Karnezos | 437/210 |

FOREIGN PATENT DOCUMENTS

| 895350 | 1/1945 | France | 72/273 |
| 515678 | 2/1955 | Italy . | |
| 8-203958 | 8/1996 | Japan . | |
| 4440186 | 8/1974 | U.S.S.R. | 72/334 |
| 12137 | 10/1885 | United Kingdom | 72/334 |
| 767854 | 2/1957 | United Kingdom | 72/334 |

*Primary Examiner*—Daniel C. Crane
*Attorney, Agent, or Firm*—Flynn, Theil, Boutell & Tanis, P.C.

[57] ABSTRACT

An object of the present invention is to provide a method for forming a recess portion having an predetermined shape on one side of a metal plate without giving the metal plate any remarkable stress while forming the other side flat, which is suitable for a package for electronic parts such as an integrated circuit, etc. The method according to the present invention is characterized in that a recess portion having an predetermined shape is formed by plastically deforming a metal plate having a predetermined thickness by means of a press, etc. so as to form the recess portion having a depth smaller than the thickness on one side thereof and to form at the same time a protruding portion protruding on the other side of the metal plate. In the steps of plastically deforming the metal plate, metal corresponding to the recess portion is displaced to the protruding portion. Then, the protruding portion on the other side is removed by cutting processing to form the recess portion only on the one side of the metal plate and to form the other side flat.

16 Claims, 5 Drawing Sheets

METHOD FOR FORMING A RECESS PORTION ON A METAL PLATE

FIELD OF THE INVENTION

The present invention relates to a method for forming a recess portion having a predetermined shape on one side of a metal plate while keeping another side flat and more in detail to a method for forming a recess portion on a metal plate by plastically deforming processing by means of a press, etc. and to a package for electronic parts fabricated by same method.

DESCRIPTION OF THE RELATED ART

Figure 8:
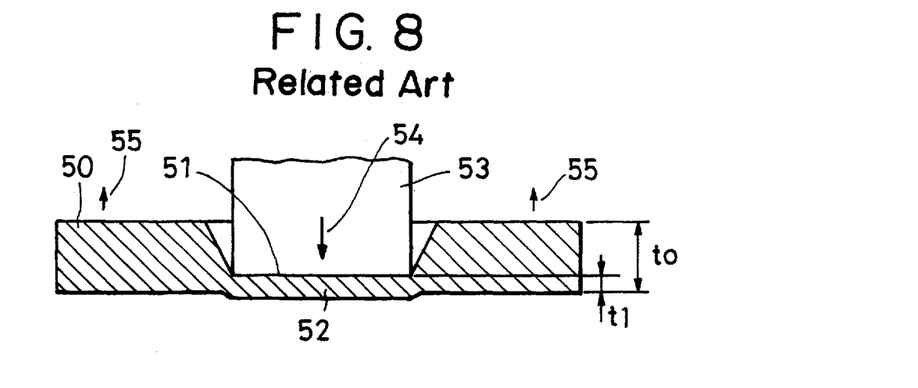
FIG. 8 is a cross-sectional view showing a related art method for forming a recess portion.

As methods for forming a recess portion having predetermined shapes on one side of a metal plate, there are known a pressing processing as indicated in FIG. 8 and a chemical etching processing. FIG. 8 indicates a pressing processing usually adopted, in which a punch 53 of a press is pressed downward as indicated by an arrow 54 from the upper side of a metal plate 50 having a predetermined thickness t0 so that a thickness t1 is left in a bottom portion 52 and a recess portion 51 having a predetermined shape is formed in the metal plate 50.

In another method, a recess portion is formed on one side of a metal plate by a chemical etching processing generally known.

However, the related art methods described above have following disadvantages. In the pressing processing by means of a press indicated in FIG. 8, metal corresponding to the volume of the recess portion 51 is stuffed into bottom and surrounding portions thereof by the punch 53 of the press. Therefore, composition of the bottom and surrounding portions are compressed which gives rise to remaining stress of the metal plate 50 and curling of the surrounding portion in direction indicated by arrows 55. In this way evenness of the metal plate 50 is remarkably worsened. Further, a protrusion is produced at the other side of the metal plate 50 by a pressure added to the recess portion 51 and the evenness is so remarkably worsened that rectification thereof is impossible. Particularly, the recess portion 51 is deformed over time due to influences of the remaining stress so as to change its sizes, which gives rise to a serious problem on the quality of the product using the metal plate 50 with a recess potion 51. Further, in case where the product is a package for an integrated circuit, desired performances of the integrated circuit cannot be obtained because its thermal conductivity decreases due to the change in metal composition by the pressure added thereto. Still further, in this method, a high output press which produces a great pressing force is necessary in order to form the recess portion 51 by the pressing processing. And at the same time, the punch 53 must be exchanged so frequently to keep its durability. Thus, this method has a problem that fabrication cost is necessarily raised.

In the chemical etching method, in which the recess portion is formed by chemically dissolving metal on one side surface of the metal plate, it takes long time to dissolve and fabrication cost is necessarily raised. Therefore it is not appropriate for mass production. Further, it is not possible to control dissolution process in a part separately from another part so that dimensional precision in the etching method is low. Thus, the practical use of the etching method is very limited.

On the other hand, with recent progress of downsizing of telecommunication and information apparatuses, electronic parts such as semiconductor integrated circuits, hybrid circuits, etc. are becoming downsized and denser, and at the same time high density mounting techniques for electronic parts are used in practice. In the high density mounting techniques, hundreds of terminal portions on wing boards such as TAB films, flexible printed boards, etc. are connected with hundreds of terminals of the electronic parts by wire bonding, flipping chips and so on. Since the wiring boards are not rigid, the electronic parts thereon are warped. In order to reinforce the electronic parts, a metal plate called "stiffener", which has a window or a recess for accommodating them at the center, is used as their package. Further, since an amount of heat generated in the electronic parts increases with their increasing density, a heat spreader for evacuating the heat therefrom is used together with the stiffener.

As for the construction of the package, there are proposed a heat spreader adhesion type, in which the stiffener and the heat spreader are stuck by means of an adhesive, and a heat spreader integrating type, in which the stiffener and the heat spreader are formed in one body with a metal plate. The heat spreader integrating type is roughly divided into a dished type, in which a metal plate having a relatively small thickness is subjected to drawing so as to form a recess portions for accommodating the electronic parts such as semiconductor integrated circuits, and a cavity type, in which the recess portion is formed by working only on one side of the metal plate. The cavity type is superior to the dished type because the important characteristics required for the stiffener such as rigidity and evenness are satisfactorily high.

However it is difficult to apply the related art methods for forming a recess portion to the package of the electronic parts because of various problems as described above.

SUMMARY OF THE INVENTION

The present invention has been made in order to solve the problems as described above, and an object thereof is to provide a method for forming a recess portion having a predetermined shape on one side of a metal plate without giving the metal plate any remarkable stress, and another object is to provide a package for electronic parts fabricated by same method.

In accordance with the invention, a method for forming a recess portion on a metal plate comprises steps of plastically deforming the metal plate in such manner that the recess portion having a predetermined shape is formed on one side of the metal plate, simultaneously forming a protruding portion on the other side of the metal plate by displacing a volume of metal corresponding to the recess portion, and removing the protruding portion by cutting. A depth of the recess portion is smaller than a thickness of the metal plate and the recess portion is formed only on one side while keeping the other side flat. The protruding potion is analogous to and slightly smaller than the recess portion. The steps of plastically deforming the metal plate, simultaneously forming the protruding portion and removing the protruding portion by cutting are repeated in cycle a plurality of times until the recess portion having predetermined shape is formed. The step of removing the protruding portion by cutting is repeated steps of shaving off the protruding portion bit by bit in thickness. The protruding portion includes a number of pillar-shaped protrusions such as rectangular pairs, circular pillars or oddly shaped pillars. The step of plastically deforming the metal plate is achieved by means of a press.

Further in accordance with the invention, the package for electronic parts compresses a metal plate, a recess portion for accommodating the electronic parts which is formed by a press on one side of the metal plate, a terminal portion disposed on a surface of the metal plate, the terminal portion being electrically connected with terminals of the electronic parts, and a cut surface portion formed on the other side of the metal plate, the cut surface portion being formed by removing a protruding portion which is formed simultaneously by the press. The depth of the recess portion is smaller than a thickness of the metal plate and the other side of the metal plate is cut flat. The metal composition of a bottom portion of the recess portion is substantially same as other portion of the metal plate. The cut surface portion is slightly smaller than and analogous to the recess portion. The protruding portion includes a number of pillar-shaped protrusions such as rectangular pillars, circular pillars or oddly shaped pillars and the cut surface portion includes a number of rectangles, circles or oddly shapes.

DESCRIPTION OF THE PREFERRED EMBODIMENTS

Hereinafter the method for forming a recess portion according to the present invention will be explained in detail, based on a mode of realization indicated in drawings.

Figure 1:
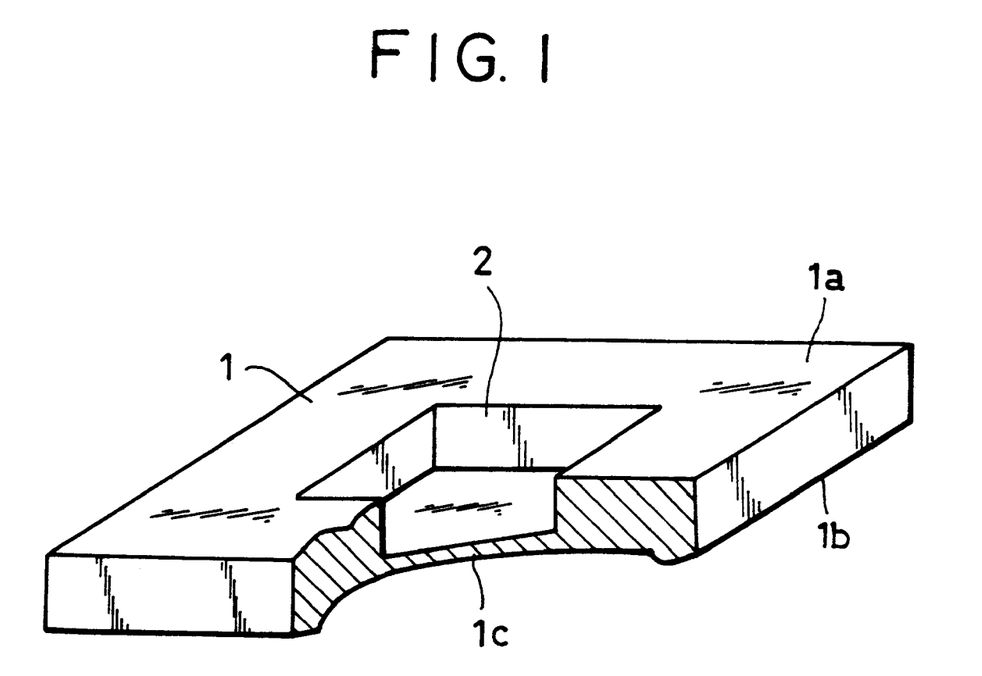
FIG. 1 is a perspective view showing a product fabricated by the method for forming a recess portion in a metal plate according to the present invention.

FIG. 1 shows a stiffener of a package for accommodating a chip of an integrated circuit in a recess portion and for evacuating heat produced by the integrated circuit, as an example of a product fabricated by the method for forming a recess portion in a metal plate according to the present invention. This stiffener is made of a metal raw material such as aluminum, copper, etc., which has a relatively high thermal conductivity and to which plastically deforming processing is applicable. As indicated in the figure, an approximately rectangular recess portion 2 is formed at the central portion on one side 1a of the metal plate 1 and a bottom portion 1c having a predetermined thickness is formed at a position on the other side 1b corresponding to the recess portion 2.

Then, a method for forming the recess portion 2 of the stiffener will be explained. FIGS. 2A to 2G show a method for forming the recess portion 2 having a predetermined shape by a press on one side 1a of the metal plate 1, where a protruding portion 3 slightly smaller than and analogous to the recess portion 2 is simultaneously formed on the other side 1b and the protruding portion 3 is removed by cutting processing so as to make the surface on the other side 1b flat.

Figure 2A:
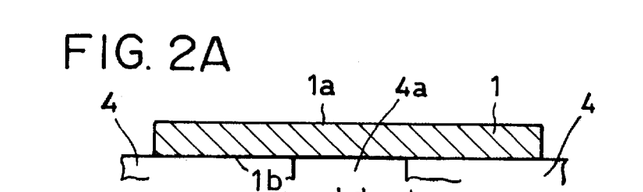
FIGS. 2A to 2G are diagrams for explaining steps for forming a recess portion according to the present invention.
Figure 2B:
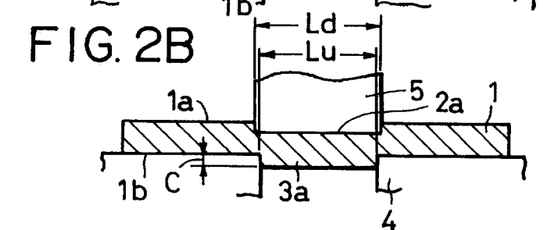

First, as shown in FIG. 2A, the metal plate 1 is positioned with respect to a die 4 of a press which has a recess 4a at predetermined portion. As a raw material for the metal plate 1, a metal having a relatively high thermal conductivity such as copper, aluminum, etc. is preferable. FIG. 2B shows a step of the first pressing processing. A preliminary recess portion 2a which is shallower than the recess portion 2 is formed on one side 1a of the metal plate 1 by means of a punch 5 of the press. At the same time, a part of metal corresponding to the preliminary recess portion 2a is displaced to the other side 1b by the pressure added by the press. As the result, a protruding portion 3a protruding from the surface on the other side 1b of the metal plate 1 is formed so as to have a height C approximately equal to the depth of the preliminary recess portion 2a. The outer perimeter of the protruding portion 3a is slightly smaller in size Ld than the outer perimeter of the preliminary recess portion 2a. Also the protruding portion 3a is analogous in shape to the preliminary recess portion 2a and centered under the preliminary recess portion. This is accomplished by setting the size of the recess 4a of the die 4 is so set it is smaller than the size of the preliminary recess portion 2a. Thus, the protruding portion-defining outer perimeter of die recess 4a is smaller in size that the recess-defining outer perimeter of the punch 5.

Since such a relation in size is set, even if the recess portion 2a is formed by the press too deep within the thickness of the metal plate 1, the protruding portion 3a is not cut-off from the metal plate 1 at its edge portion, and it is always kept joined thereto. It is desirable to set the height C of the protruding portion 3a at such a value that it can be shaved off with the minimum stress at the cutting processing described later.

Figure 2C:
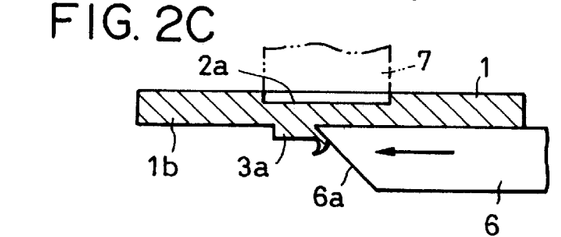
Figure 2D:
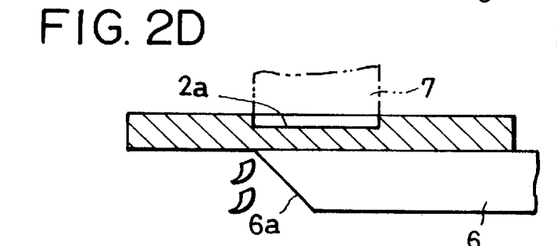
Figure 4A:
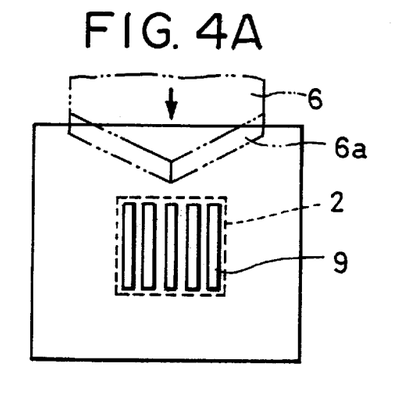
FIGS. 4A to 4C are plan views showing examples of modified protruding portions according to the present invention.
Figure 4B:
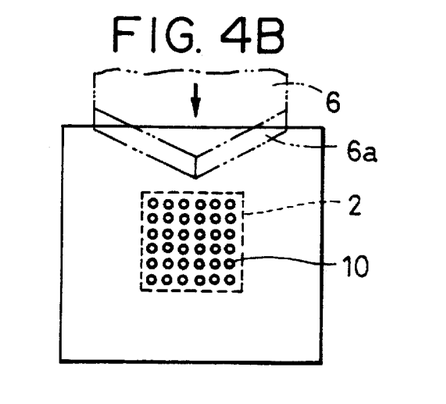

FIGS. 2C and 2D show a first cutting processing, in which the protruding portion 3a formed on the other side 1b of the metal plate 1 by the first pressing process is shaved off means of a cutter 6 so that the cut surface newly obtained by the shaving is coplanar with the other part of the surface of the other side 1b. The cutter 6 used for the cutting processing has an arrow-shaped blade 6a, whose extremity is pointed at the center as indicated in FIGS. 4A and 4B. The cutter 6 is advanced in the direction indicated by an arrow in FIG. 2C, that is to say, form the front end to the rear end, in a state that the pointed center of the extremity of the blade 6a is in accordance with the center line of the protruding portion 3a. When the blade 6a has been advanced up to the rear end of the protruding portion 3a, the cutting processing is terminated as indicated in FIG. 2D. In this cutting processing it is desirable that a pressing tool 7 is inserted into the preliminary recess portion 2a, keeping it under pressure, in order to prevent that the bottom portion 1c is displaced by the cutter 6 towards the preliminary recess portion 2a.

Figure 2E:
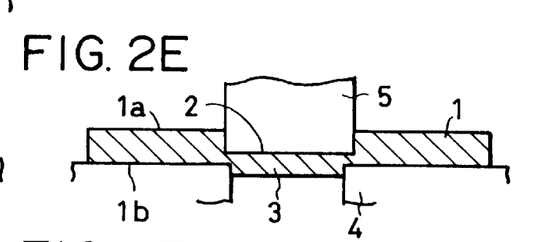

Next FIG. 2E shows a step of the second pressing processing, in which the second pressing processing is executed by means of the punch 5 and the die 4 of the press in order to make the preliminary recess portion 2a formed by the first pressing processing deeper, and to form the recess portion 2 having the final depth. At the same time, a protruding portion 3 whose height is approximately equal to the increased depth of the recess portion, is formed on the other side 1b of the metal plate 1, similarly to the first processing. The outer size of this protruding portion 3 is slightly smaller than the inner size of the recess portion 2 and the protruding portion 3 is analogous to the recess portion 2.

Figure 2F:
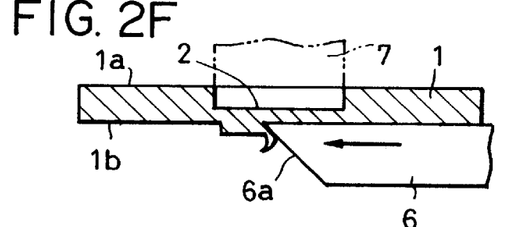
Figure 2G:
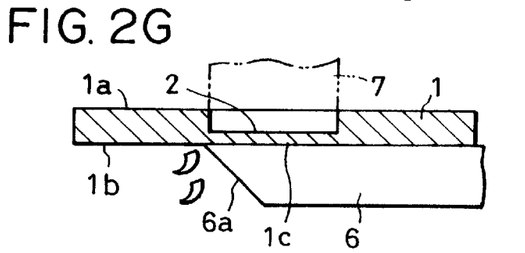

Then a second cutting processing indicated in FIG. 2F is effected. That is, similarly to the first cutting processing, the protruding portion 3 formed on the other side 1b of the metal plate 1 by the second pressing processing is shaved off by means of the cutter 6 so that the cut surface newly obtained by the shaving is coplanar with the other part of the surface of the other side 1b. The cutter 6 used at this second processing is the same as that used in the first cutting processing. While the pressing tool 7 is inserted in the recess portion 2, the protruding portion 3 is shaved off, as indicated in FIG. 2G, by advancing the cutter 6 up to the rear end of the protruding portion 3 in the direction indicated by an arrow in FIG. 2C, to make the other side 1b of the metal plate 1 flat.

By the steps described above, the recess portion 2 indicated in FIG. 1 is formed on the one side 1a of the metal plate 1. And the bottom portion 1c having a relatively small predetermined thickness is formed at the bottom of the recess portion 2. The steps indicated in FIGS. 2A to 2G, that is to say, the steps of the first pressing processing through the first cutting processing and the steps of the second pressing processing through the second cutting processing can be successively repeated a plurality of times so as to increase the depth of the recess portion 2 step by step, to shave off the protruding portion 3 which is formed thin in each step and to form a thin bottom portion 1c.

This method is suitable for preventing infliction of remaining stress on the metal plate. In case where the thickness of the bottom portion 1c located at the bottom of the recess portion 2 is relatively small, since tensile force applied to the bottom portion 1c by the shaving is small, there is no fear to destroy the bottom portion 1c. In addition, since pressing force in each of the pressing processing can be small enough, the processing can be effected by means of a small size press.

Although in the example of the method indicated in FIGS. 2A to 2G a recess portion 2 is formed for one metal plate 1, a plurality of recess portions, e.g. from 2 to 5, may be formed simultaneously for one metal plate having a large area. The recess portions may be not only rectangular, but also circular or polygonal.

Figure 5:
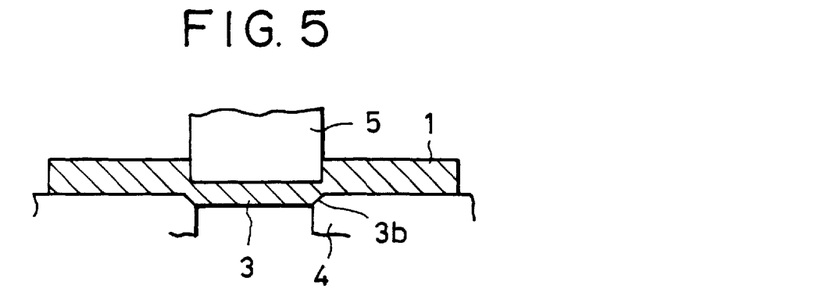
FIG. 5 is a cross sectional view showing a modified example of the method for forming a recess portion in a metal plate according to the present invention.

Further, as forming the recess portion 2, the protruding portion 3 can be not necessarily rectangular, as explained referring to FIGS. 2A to 2G, but it may be formed approximately trapezoidal by forming tapered portions 3b from the base surface of the metal plate 1 to the extremity thereof, as indicated in FIG. 5.

Figure 6:
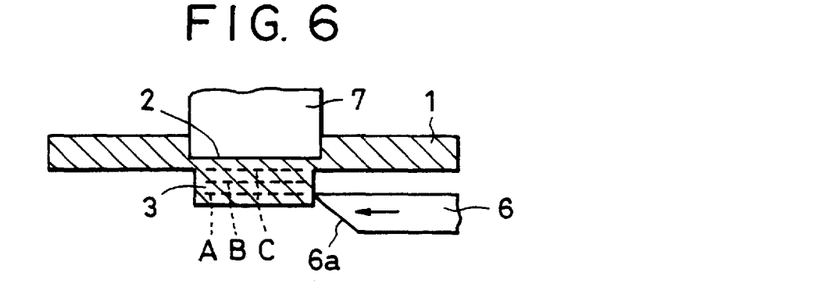
FIG. 6 is a crossectional view showing another example of the method for forming a recess portions in a metal plate according to the present invention.

FIG. 6 shows a modified example of the method for forming a recess portion indicated in FIGS. 2A to 2G. That is, a recess portion 2 and protruding portion 3 are formed by one pressing processing. Thereafter a first cutting processing is effected, so that a part of the thickness of the protruding portion 3 is shaved off along a line indicated by A. Then a second cutting processing is effected so that it is shaved along a line indicated by B and finally a third cutting processing is effected, by which remaining part of the protruding portion 3 is shaved off along a line indicated by C. In this way, the cutting processing is repeated a plurality of times and the protruding portion 3 having a predetermined thickness is removed by shaving off step by step. According to this method for forming a recess portion, since the recess portion 2 is formed by one pressing processing, the fabrication process is simplified and efficiency thereof is improved. Further, since the thickness of protruding portion 3 shaved off by one cutting processing is small, infliction of remaining stress and direct stress on the metal plate 1 is prevented and it remains as is, similarly to the example described referring to FIGS. 2A to 2G.

Figure 7:
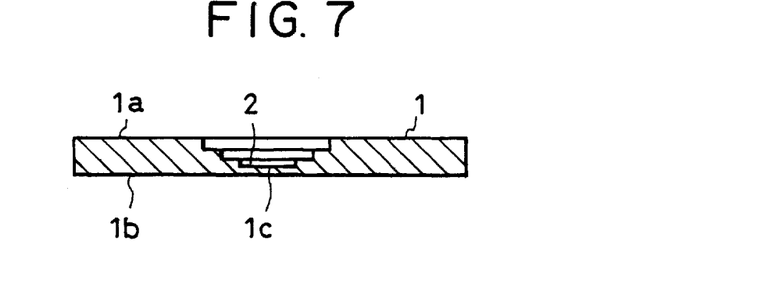
FIG. 7 is a cross-sectional view showing a modified example of a recess portion formed on a metal plate.

In the embodiments described above, in case where the metal plate 1 is thin, or in case where relatively shallow recess portions are sufficient, a pair of the pressing processing and the cutting processing may be satisfactory. Further the recess portion 2 may be formed in a multi-stage shape, in which the depth increases discontiuously with decreasing distance from the center, as indicated in FIG. 7, or approximately in a cone shape. Thus the recess portion 2 can have an predetermined shape.

FIGS. 3A to 3D show another example of the method for forming a recess portion in a metal plate according to the present invention. The example show a method for forming the recess portion 2 having a predetermined shape on one side 1a of a metal plate 1 and a protruding portion simultaneously by plastically deforming processing, where the protruding portion includes a number of pillar-or-pier-shaped protrusions protruding from the surface of the other side 1b corresponding to the recess portion 2, and for removing these pillar-or-pier-shaped protrusions by a cutting processing.

Figure 3A:
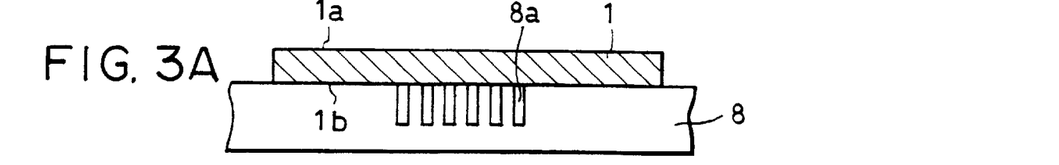
FIGS. 3A to 3D are diagram for explaining other steps for forming a recess portion according to the present invention.
Figure 3B:
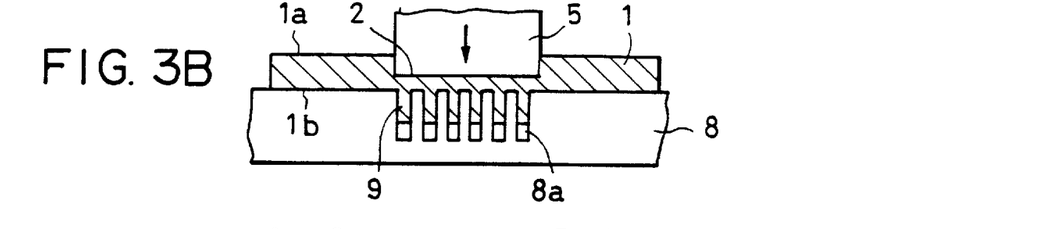

As shown in FIG. 3A, the metal plate 1 is positioned with respect to a die 8 of a press. As a raw material for the metal plate 1 indicated in FIG. 3A, copper, aluminum, etc. Are selected, similarly to the example indicated in FIGS. 2A to 2G. FIG. 3B shows a step of the pressing processing, in which the recess portion 2 is formed by press on one side 1a thereof by means of a punch 5 mounted on the press. In the die 8 there are dug a plurality of grooves 8a at a place corresponding to the lower part of the recess portion 2. The collective length across the grooves 8a is less than the corresponding length across the overlying punch 5. When the recess portion 2 is formed by the punch 5, an amount of metal approximately equal to the volume of the recess portion 2 is displaced to the plurality of grooves 8a so that a number of piers 9 (corresponding to the protruding portion) protrude from the surface of the other side 1b, as indicated in FIG. 4A.

In the method for forming a recess portion indicated in FIGS. 3A through 3D, the protruding portion may not only be the piers 9 but also be a number of circular pillars 10, as indicated in FIG. 4B. Also as indicated in FIG. 4C, the pillars can have curved cross-sectional profiles or a profile that is both curved and straight edged so that they can be easily shaved off in a later cutting processing. Further the protrusions forming protruding portion can be rectangular pillars and other suitable shapes, which are selected depending on conditions of the raw material, the cutter, etc.

Figure 3C:
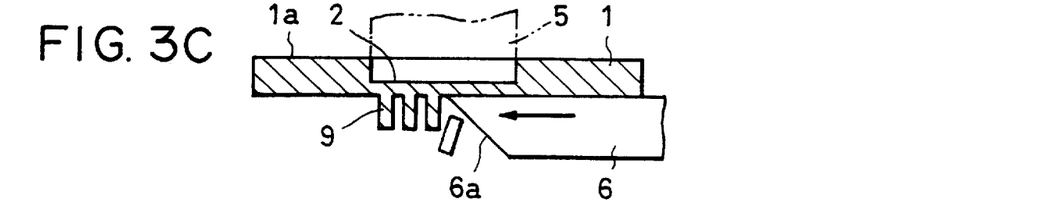
Figure 3D:
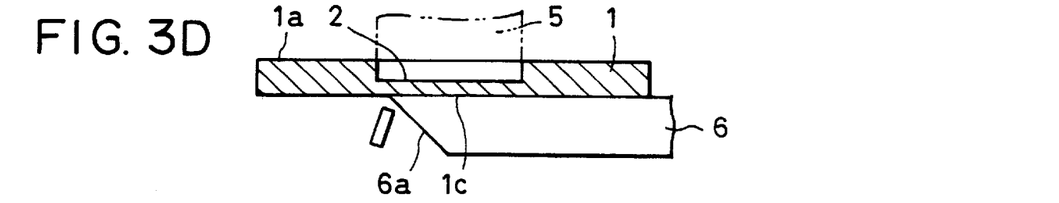
Figure 4C:
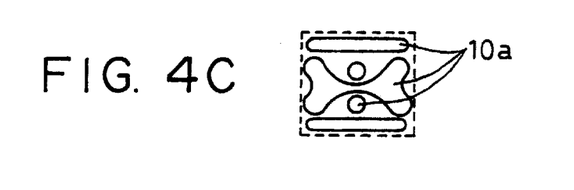

FIG. 3C shows a cutting processing, in which the number of piers 9 formed on the other side 1b of the metal plate 1 are removed in such manner that each of the piers 9 is cut away by the cutter 6 at its root so that the cut surface after the cutting is coplanar with the other part of the other side 1b. At this time, the cutter 6 is moved in the direction indicted by an arrow in FIG. 4A, that is to say, in the direction parallel to the longitudinal direction of the piers 9 and in a state where the pointed center of the extremity of the cutter blade 6a is in accordance with the center line of the protruding portion formed by the piers 9. The piers 9 have been cut away, as indicated by FIG. 3D, by advancing the cutter 6 up to the rear end of the piers so as to form a flat cut surface on the other side 1b. During this cutting processing the interior of the recess portion 2 is pushed by a pressing tool 7 in order to prevent displacement of the bottom portion 1c similarly to the example indicated in FIG. 2A through 2G.

In the method described above, the recess portion 2 indicated in FIG. 1 is formed on the one side 1a of the metal plate 1, while forming the bottom portion 1c having a predetermined thickness at the bottom of the recess portion 2 and cut surface on the other side b1 of the metal plate 1. In the steps indicated in FIGS. 3A to 3D, since a number of piers 9 are formed by the plastically deforming processing and these piers 9 are cut away by the cutting processing, the area cut away by the cutter 6 is small so that the piers 9 can be cut away with a small force. For this reason, remaining stress and direct stress to the metal plate 1 can be kept small. Further, since the pressing force to plastically forming the piers 9 can be small, the plastically deforming processing can be effected by means of a small size press.

Although a cutter having a blade in the cutting processing is used in the modes of realization explained above, the cutting processing may be effected by milling processing or a processing by means of a grinder. The present invention is not restrict thereto, but various modifications may be possible, unless they deviate from the scope of the present invention.

Figure 9:
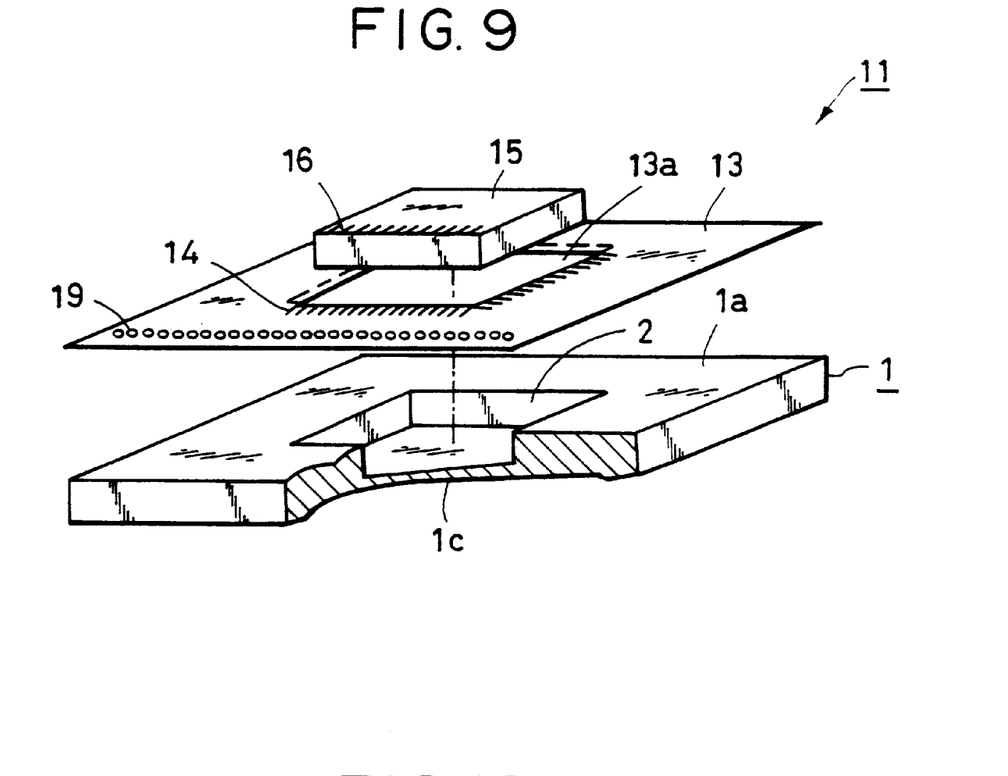
FIG. 9 is an exploded perspective view of a package for electronic parts according to the present invention.
Figure 10:
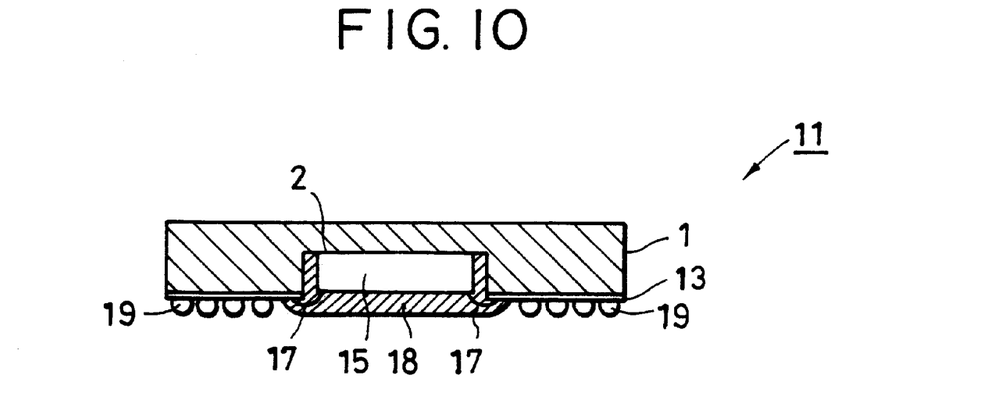
FIG. 10 is a cross-sectional view of the package indicated in FIG. 9.

FIGS. 9 and 10 show an example of a package for a electronic parts such as a semiconductor integrated circuit, in which the present invention is applied. The package 11 includes a stiffener comprising a metal plate 1 which has a certain rigidity, a thermal expansion coefficient matching well to that of wiring boards, etc. described later as well as a high thermal conductivity required as a heat spreader, and for which plastically deforming processing is possible. Thus, as the metal raw material of the metal plate 1, a copper alloy, stainless steel or aluminum is adopted. An approximately rectangular recess portion 2 having a bottom portion 1c with a predetermined thickness is formed at the center of the surface on one side 1a of the metal plate 1. That is, this package 11 is formed in a cavity type as a whole.

A wiring board 13, which is a TAB or flexible printed board, a usual pointed board, etc., is stuck and secured to the one side 1a of the package 11 by means of an adhesive. The wiring board 13 may be a layer on which a wiring circuit is formed and by which the wiring circuit is insulated from the metal plate 1. An opening 13a having an approximately same size as the recess portion 2 is formed in this wiring board 13. A terminal portion 14 having a number of terminals is formed by printed wiring on the periphery of this opening 13a with a wire width and a pitch of about 37 nm. The terminals of the terminal portion 14 are electrically connected by printed wiring to externally connecting terminals (not indicated in the figures), which are formed on an outer periphery of the wiring board 13.

Further a chip 15 of electronic parts such as a semiconductor integrated circuit is accommodated in the recess portion 2 formed on the one side 1a of the package 11. The chip 15 is stuck to the bottom portion 1c of the recess portion 2 by means of an adhesive in a state where a surface of the chip 15 and that of the bottom portion 1c are tightly fitted. What is important in this sticking using an adhesive is that no bubbles should be produced between the chip 15 and the bottom portion 1c of the recess portion 2. This is because the bubbles are expanded and the chip 15 may be thereby peeled off in case where heat is produced during working of the electronic parts in the chip 15 and in case where heat is subjected to the package 11 during its assembling to an apparatus. Thus, the bottom portion 1c of the recess portion 2 should be formed in such an evenness that warp is smaller than 30 nm.

On the upper surface of the chip 15 there are disposed a number of terminals 16 with a same wire width and a same pitch as those in the terminal portion 14 formed on the wiring board 13. Each of the terminals 16 of the chip 15 and each terminal of the terminal portion 14 of the wiring board 13 are electrically connected by bonding wires 17, as indicated in FIG. 10. Further sealing agent 18 is injected into the recess portion 2 of the package 11 to seal the chip 15 and the bonding wires 17.

When the electronic parts such as an integrated circuit packed in the package 11 as described above is mounted onto a circuit board of an electronic apparatus not indicated in the figure, solder balls 19 are placed on the externally connecting terminals formed on an outer periphery of the wiring board 13 and they are melted by heating in a state where the package 11 is provisionary fixed at predetermined position on the circuit board of the electronic apparatus. In this way the electronic parts packed in the package 11 and the circuit board of the electronic apparatus are connected electrically via the wiring board 13 without any damages to the package 11 and its electronic parts due to expanding the bubbles between the chip 15 and the bottom portion 1c. In case where heat is produced during working of the electronic pats in the chip 15, since the package 11 itself has a function of a heat spreader, heat is transmitted to the stiffener of the package 11 and is evacuated at the same time. In this case, the function of the heat spreader is kept sufficient because the thermal conductivity of the metal plate dose not decreases without change in metal composition during steps of its fabrication.

As described above, in the method for forming a recess portion on a metal plate according to the present invention, the recess portion having a predetermined shape is formed on one side of the metal plate by plastically deforming the metal plate using a press, etc. and at the same time, a protruding portion protruding from the other side of the metal plate is formed. And the protruding portion is removed by cutting processing so as to make the other side flat and to form a cut surface thereon. It is possible to form the recess portion having a predetermined shape only on one side of the metal plate without giving the metal plate any remarkable stress or changing the composition of the metal plate because metal corresponding to the recess portion is displaced to the protruding portion on the other side of the metal plate by plastically deforming processing. Owing to the fact that the metal corresponding to the recess portion is displaced to the protruding portion on the other side, the recess portion can be formed easily even by using a small size press having a small pressing force, and further a life of a punch, etc. used for forming the recess portion and a life of a cutting tool used for cutting the protruding portion can be elongated. Thus, according to the method it is possible to reduce fabrication cost.

Further, in the cavity type package for electronic parts according to the present invention, the stiffener of the package is made of a metal plate with a recess portion having a predetermined shape on one side thereof formed by plastically deforming processing by means of a press, etc., where a protruding portion protruding from the other side of the metal plate is formed at the same time and this protruding portion is removed by cutting processing so as to form the other side of the metal plate flat. It is possible to form the recess portion without giving the metal plate any remarkable stress during plastically deforming processing even by means of a press and without changing the composition of the metal plate because metal corresponding to the recess portion is displaced to the protruding portion on the other side. Further, because the protruding portion is shaved or cut off without giving the metal plate any remarkable stress and deformation, it is possible to obtain easily evenness and precision required of the stiffener of the package, particularly of the bottom of the recess portion so that the chip of electronic parts accommodated in the recess portion can be stuck and fixed tightly to the bottom portion of the recess portion. Additionally, the function of the metal plate as a heat spreader is kept sufficient because the thermal conductivity of the metal plate dose not decreases without change in metal composition during steps of its fabrication.

What is claimed is:

1. A method for forming a recess portion on a metal plate comprising steps of:

plastically deforming a section of a metal plate in such manner that a recess portion is formed on a first side of the metal plate;

simultaneously forming a protruding portion on a second side of the metal plate that is opposite the first side by displacing a volume of metal corresponding to the recess portion;

removing said protruding portion of the metal plate by cutting the protruding portion away from the metal plate; and repeatedly performing said step of plastically deforming the section of the metal plate subjected to the initial deforming step while simultaneously performing said step of forming the protruding portion until the recess portion defines a predetermined shape and repeatedly performing the step of removing the protruding portion.

2. The method for forming a recess portion on a metal plate according to claim 1, wherein a depth of the recess portion is smaller than a thickness of the metal plate and the recess portion is formed only on the first side of the metal plate while keeping the second side flat.

3. The method for forming a recess portion on a metal plate according to claim 1, wherein said step of plastically deforming the metal plate is performed by means of a press.

4. The method for forming a recess portion on a metal plate of claim 3, wherein:

said press has a punch that is shaped to form the recess portion, the punch being shaped define the outer perimeter of the recess portion;

said press has a die on which the metal plate is supported, the die being shaped to define a die recess that is located below the punch, the die recess being shaped to define the outer perimeter the protruding portion and the die recess is shaped so that protruding portion will have an outer perimeter that is smaller in size than the outer perimeter of the recess portion; and said steps of plastically deforming the section of the metal plate and forming the protruding portion are performed by forcing the punch against the section of the metal plate so the punch forms the recess portion and causes the protruding portion to form in the die recess.

5. The method for forming a recess portion on a metal plate of claim 1, wherein, after each said pair of steps of plastically deforming the metal plate and simultaneously forming the protruding portion are performed, said step of removing the protruding portion is performed.

6. A method for forming a recess portion on a metal plate, said method comprising the steps of:

plastically deforming a metal plate in such a manner that a recess portion having a predefined shape with an outer perimeter is formed on a first side of the metal plate wherein, said deforming step causes a protruding portion to simultaneously be formed on a second side of the metal plate opposite the first side, the protruding portion being centered on the recess portion and having an outer perimeter analogous in shape to the outer perimeter of the recess portion and the outer perimeter of the protruding portion is smaller in size than the outer perimeter of the recess portion; and removing the protruding portion by cutting sections of the protruding portion away from the metal plate in a plurality of cutting steps.

7. The method for forming a recess portion on a metal plate of claim 6, wherein: the metal plate has a thickness; the recess portion is formed to have a depth, the depth of the recess portion being less than the thickness of the metal plate; and, during said step of deforming the metal plate, the portion of the second side of the metal plate that surrounds the portion of the second side forming the protruding portion is kept flat.

8. The method of forming a recess portion on a metal plate of claim 6, wherein: said step of plastically deforming the metal plate is performed with a press.

9. The method of forming a recess portion on a metal plate of claim 6, wherein:

the metal plate is placed on a die that functions as a support surface for the metal plate and the die is formed to define a recess that has an outer perimeter having a size and shape equal to the size and shape of the protruding portion to be formed; and after said step of placing the metal plate on the die, said step of plastically deforming the metal plate is performed wherein, in said step of plastically deforming the metal plate, a section of the metal plate located above the die recess is pressed towards the die, the section of the metal plate pressed towards the die having an outer perimeter that is larger in size than the die recess and that subtends the die recess.

10. The method of forming a recess portion on a metal plate of claim 9, wherein said step of plastically deforming the metal plate is performed with a press punch, the press punch having a outer perimeter that is larger in size than the outer perimeter of the die recess.

11. The method of forming a recess portion on a metal plate of claim 9, wherein said die is formed so that the die recess comprises a plurality of grooves so that, in said step of plastically deforming the metal plate, the protruding portion is formed to comprise a plurality of spaced apart pillars that form in the grooves that form the die recess.

12. A method for forming a recess portion on a metal plate, said method comprising the steps of:

plastically deforming a metal plate in such a manner that a recess portion having a volume is formed on a first side of the metal plate wherein said deforming step causes a protruding portion to simultaneously be formed on a second side of the metal plate opposite the first side, the protruding portion having a plurality of spaced apart pillars that are formed by displacing a volume of metal approximately equal to the volume of the recess portion; and removing the protruding portion by cutting the pillars away from the metal plate.

13. The method of forming a recess portion on a metal plate of claim 12, wherein the metal plate has a thickness; the recess portion is formed to have a depth, the depth of the recess portion being less than the thickness of the metal plate; and, during said step of deforming the metal plate, the portion of the second side of the metal plate that surrounds the portion of the second side forming the protruding portion is kept flat.

14. The method of forming a recess portion on a metal plate of claim 12, wherein: said step of plastically deforming the metal plate is performed with a press.

15. The method of forming a recess portion on a metal plate of claim 12, wherein the pillars are forced to have a cross sectional profile selected from the group of shapes consisting of: rectangular, circular, curved and combined curved and straight edged.

16. The method of forming a recess portion on a metal plate of claim 12, wherein:

the metal plate is placed on a die that functions a support surface for the metal plate and the die is formed to have a plurality of grooves and the die grooves collectively subtend a set length along the surface of the die;

in said step of plastically deforming the metal plate, a section of the metal plate located above the die grooves is pressed toward the die so that the pillars form in the die grooves wherein, the section of the metal plate that is pressed toward the die both subtends the die grooves and is longer in length than the length subtended by the die grooves so that the recess portion formed in the metal plate extends on either side of the length subtended by the pillars formed in the die grooves.

* * * * *

UNITED STATES PATENT AND TRADEMARK OFFICE
CERTIFICATE OF CORRECTION

PATENT NO. : 6 145 365
DATED : November 14, 2000
INVENTOR(S) : Hideyuki MIYAHARA

It is certified that error appears in the above-identified patent and that said Letters Patent is hereby corrected as shown below:

Column 11, line 9; change "forced" to ---formed---.

Signed and Sealed this

Twenty-ninth Day of May, 2001

Attest:

NICHOLAS P. GODICI

Attesting Officer        Acting Director of the United States Patent and Trademark Office